United States Patent [19]

Denis et al.

[11] Patent Number: 4,740,917
[45] Date of Patent: Apr. 26, 1988

[54] MEMORY USING CONVENTIONAL CELLS TO PERFORM A RAM OR AN ASSOCIATIVE MEMORY FUNCTION

[75] Inventors: Bernard Denis, Mennecy; Dominique Omet, Evry, both of France

[73] Assignee: International Business Machines Corporation, Armonk, N.Y.

[21] Appl. No.: 797,068

[22] Filed: Nov. 12, 1985

[30] Foreign Application Priority Data

Nov. 30, 1984 [EP] European Pat. Off. ........ 84430040.0

[51] Int. Cl.$^4$ .................. G11C 7/00; G11C 15/00; G11C 15/04
[52] U.S. Cl. ................................. 365/49; 365/174; 365/179; 365/189; 365/195
[58] Field of Search ................. 365/49, 174, 189, 179, 365/191, 195, 196; 364/200, 900

[56] References Cited

U.S. PATENT DOCUMENTS

| | | | |
|---|---|---|---|
| 3,518,631 | 6/1970 | Lindquist et al. | 364/900 |
| 4,045,781 | 8/1977 | Levy et al. | 365/49 X |
| 4,153,943 | 5/1979 | Anderson | 365/49 X |
| 4,257,110 | 3/1981 | Lamb et al. | 365/49 |
| 4,394,752 | 7/1983 | Boudon et al. | 365/227 |
| 4,538,243 | 8/1985 | Zehner | 365/49 |
| 4,646,271 | 2/1987 | Uchiyama et al. | 365/189 X |

OTHER PUBLICATIONS

IBM Technical Disclosure Bulletin, vol. 26, No. 2, Jul. 1983, pp. 658–659, "Harper PNP Cell Layout with Improved PNP Characteristics", by R. Cullet, B. Denis and D. Omet.

IBM Technical Disclosure Bulletin, vol. 17, No. 3, Aug., 1974, pp. 884–885, "Liquid–Cooled Electronic Components for Low–End Machines", by P. J. Cunavelis and O. R. Gupta.

IBM Technical Disclosure Bulletin, vol. 23, No. 7A, Dec., 1980, pp. 2823–2824, "Associative Memory Cell", by B. A. Denis.

IBM Technical Disclosure Bulletin, vol. 23, No. 4, Sep. 1980, pp. 1473–1474, "Lay-Out of an Emitter-Coupled Cell with PNP Loads", by G. Boudon, B. Denis and P. Mollier.

*Primary Examiner*—Stuart N. Hecker
*Assistant Examiner*—Alyssa H. Bowler
*Attorney, Agent, or Firm*—Stephen J. Limanek

[57] ABSTRACT

Memory comprising a matrix of conventional Harper pnp cells and peripheral circuits which allows it to be used either as a random access memory or as an associative memory. In addition to the read/write circuits which are inhibited in search mode, it comprises search mode control circuits 7-1 to 7-m to provide the memory cells with a search argument DI-1 to DI-m and search circuits 11-1 to 11-n connected to the word lines for detecting the match or mismatch conditions. A search restore circuit 15 common to all word lines WL is used to restore the work lines to a quiescent voltage once the search operation is completed. Circuits 7 and 11 are inhibited in read/write mode.

6 Claims, 3 Drawing Sheets

MEMORY USING CONVENTIONAL CELLS TO PERFORM A RAM OR AN ASSOCIATIVE MEMORY FUNCTION

TECHNICAL FIELD

The present invention relates to a high density memory using standard write/read cells which can be used as an associative memory and as a random access memory.

BACKGROUND ART

Associative memories or content addressable memories are well known in the art.

So far, the associative memories are more expensive than random access memories (RAM) because each cell must have a storage capability as well as logic circuits for matching its content with an external argument.

Examples of such prior art cells are described in IBM Technical Disclosure Bulletin Vol. No. 3, August 1974, page 884 and Vol. No 74A, December 1980, page 2823.

In these cells, in addition to the transistors which have to be provided, for the storage and search capabilities, search or match lines are required which leads to low density associative memories.

Furthermore, the trend of present technologies is to design embedded random access memories in very large scale integration (VLSI) chips, making it of interest to use the embedded RAM cells and to personalize the peripheral circuits to perform the read/write function.

DISCLOSURE OF THE INVENTION

An object of the invention is to provide a memory using conventional random access memory cells, with peripheral circuits which allow the memory to be used either as a conventional RAM memory or as an associative memory.

An other object of the invention is to provide such a very high density memory using conventional random access memory cells, wherein there is no logic circuit associated with each cell to perform the associative function.

Another object of the invention is to provide such a memory wherein the dissipated power at the chip level is low.

The memory according to this invention comprises a matrix arrangement of cells connected to n word lines and to m left and right bit lines. The selection of the word lines is made by means of word line driver transistors which have their control electrodes (bases) connected to an address decoding and selection circuit, one of their conductive electrodes (emitters) connected to the word lines and the other conductive electrodes (collectors) connected to a supply voltage source. Read and write circuits are used for performing read or write operations in the cells connected to a selected word line.

The memory comprises peripheral circuits allowing it to be used either as a random access memory or as an associative memory. The peripheral circuits include means responsive to a search control signal for inhibiting the read/write circuits of the memory and the word address decoding and selection circuit, means for providing a reference voltage to all control electrodes of word line driver transistors in a search mode, search mode control means connected to each pair of left and right bit lines, responsive to the search control signal and to an argument data-in bit to allow the potential of one or the other left or right bit line to be lowered depending upon the argument data-in bit value, so that in the search mode a mismatch current flows into the cell when the data-in bit does not match the cell content, and detection means connected to each word line and responsive to a search reference potential for generating a signal indicative of a match condition of all cells connected to the word line and indicative of a mismatch condition of at least one cell connected to the corresponding word line.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
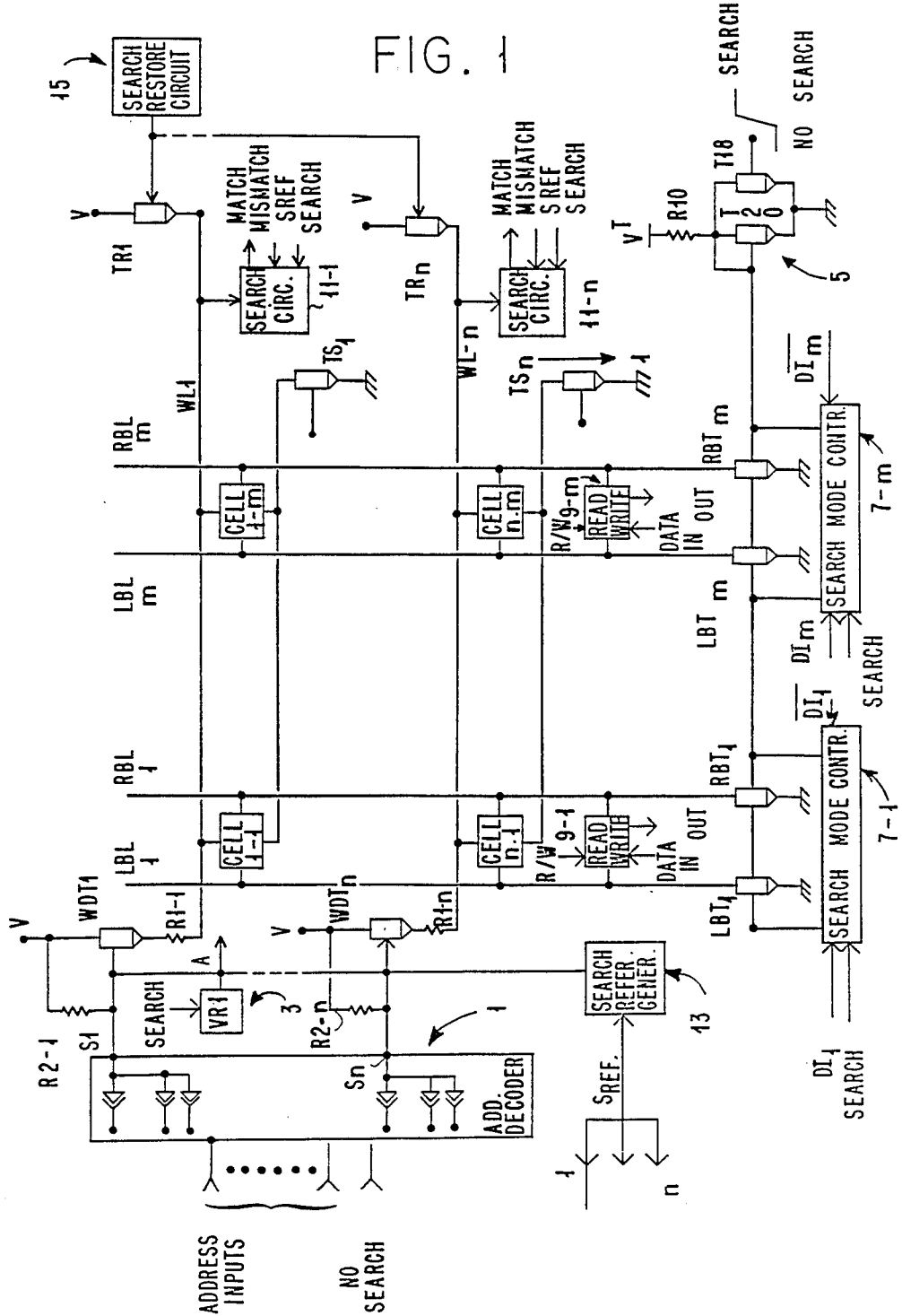
FIG. 1 shows the general arrangement of the memory cells and peripheral circuits.
Figure 2:
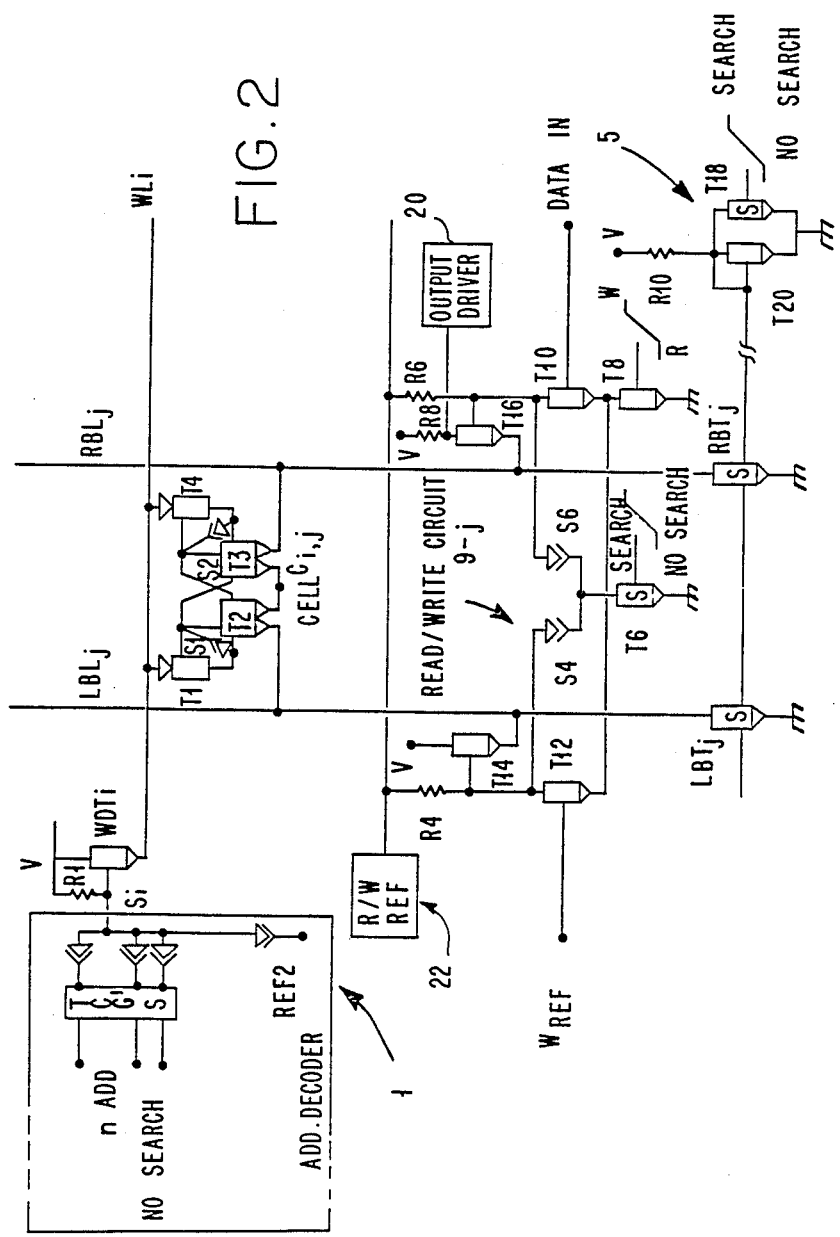
FIG. 2 is a detailed representation of one memory cell Ci,j and associated read and write circuits.
Figure 3:
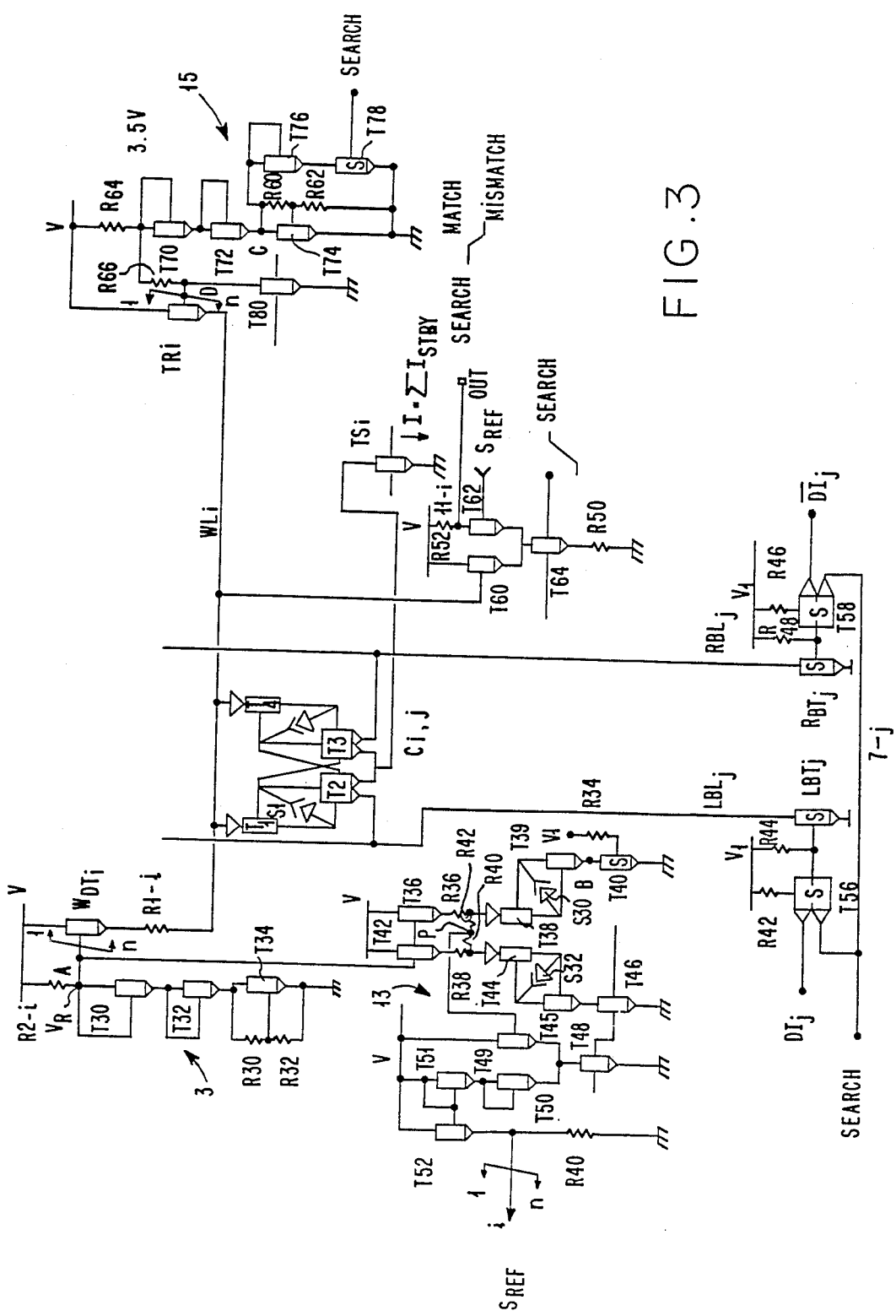
FIG. 3 is a detailed representation of one memory cell Ci,j and associated search circuits.

As shown in FIGS. 1, 2 and 3 the memory is comprised of cells arranged as a matrix of n rows and m columns, and referenced by Ci,j with $1 \leq i \leq n$ and $1 \leq j \leq m$.

Each component associated with a row or with a column of cells has a reference and a suffix which indicate the row or column number, for example, word lines WL-1 and WL-n, or transistirs $LBT_1$ and $LBT_m$.

These cells may be of the Harper pnp type such as described in the article published in the IBM Technical Disclosure Bulletin, Vol. 23, No 4, September 1980, pages 1473 and 1474, and Vol. 26, No 2, July 1983, pages 658 and 659.

The word lines are selected by means of word line driver transistors WDT which have their collectors connected to a bias voltage V, their emitters connected to the respective word lines through resistors R1 and their bases connected to an output S of address decoding and selection circuit 1 and to supply voltage V through resistor R2.

Address selection and decoding circuit 1 may be off the type described in U.S. Pat. No. 4,394,752 and comprises True/Complement generators, not shown in the drawings, and a Schottky Barrier Diode array schematically shown in the drawing. In addition to the address input signals, circuit 1 is responsive to a NO SEARCH control signal which allows the memory to be used either in read/write mode or in search mode. When this signal is at an UP level, one of the word lines may be selected according to the address input value and when this signal is at a DOWN level, the Schottky Barrier diodes connected to the no search input of circuit 1 are ON so that whatever the address input value may be, circuit 1 causes no word line to be selected.

In this case, the base potentials of the word line driver transistors WDT1 to WDTn are lowered which causes all word lines to be ready for a search operation.

Each bit line is connected to transistors LBT and RBT, they have their emitters connected to the ground, their collectors connected to the bit lines and their bases connected to control circuit 5 which causes in read/- write mode (no search mode) a current to flow in the bit line transistors.

In search mode, this current does not flow in the bit line transistors. At that time, they are controlled by means of search mode control circuits 7-1 to 7-m to which are provided the search argument bits DI to be compared with the bits stored in the memory cells.

Circuits 7-1 to 7-m receive a SEARCH control signal to be inhibited in read/write mode and the search argument bits $DI_1$ to $DI_m$.

Read/Write circuits 9-1 to 9-m are connected to the respective bit lines to cause the memory to be written or read under control of a read/write control signal R/W. A data bit to be written in each cell of a selected word is applied to the data-in input of circuits 9-1 to 9-m and the data bit read from each cell of the selected word is provided on the output OUT.

In search mode, the match or mismatch condition of the cell content in each row compared with the search argument is detected by search circuits 11-1 to 11-n which compare the word line voltage with a search reference voltage SREF.

The search reference voltage is generated by search reference generator 13 which is connected to the word driver transistor bases to adjust the search reference voltage SREF as will be described later.

The function of search restore circuit 15 common to all word lines is to restore the word lines to a standby level voltage after each search operation.

The operation of the memory will now be described in reference to FIGS. 2 and 3, wherein the peripheral circuits have been shown in more detail. Only one cell Ci,j, is represented in FIGS. 2 and 3. FIG. 2 shows the operation of the memory in read/write mode. FIG. 3 shows the operation of the memory in search mode.

Cell Ci,j, of the Harper pnp type cell, comprises PNP transistors T1 and T4, double-emitter transistors T2 and T3 and anti-saturation Schottky Barrier Diodes S1 and S2. Emitters of transistors T1 and T4 are connected to word line WLi and one of the emitters of transistors T2 and T3 is connected to left bit line and right bit line $LBL_j$ and $RBL_j$, respectively.

The base of word driver transistor WDTi is connected to the output Si of address decoder 1 to activate word line WLi when Schottky Barrier Diodes connected to output Si are OFF. When one of these diodes is ON, the corresponding word lines are not selected.

To describe the operation of read/write circuits, it is assumed that word line WLi is selected.

Each Read/Write circuit such as the one represented in the drawing, i.e., circuit 9-j, comprises a first transistor T6 with an anti-saturation diode not shown, and two Schottky Barrier Diodes S4 and S6. The emitter of T6 is grounded, its base is controlled by SEARCH signal which is at a low level when a read/write operation is performed. The collector of T6 is connected to the cathodes of diodes S4 and S6. The function of this arrangement is to inhibit circuit 9-j when a search operation is performed. In the drawing, an "S" inside a transistor component indicates that the transistor is provided with an anti-saturation Schottky Barrier diode, SBD.

A write operation is made by means of transistors T8, T10, T12, T14 and T16.

A read operation is made by means of transistors T8 and T16 and output driver 20.

Transistor T8 has its emitter grounded, its base provided with a read/write control signal R/W which is at a low level for performing a write operation and at a high level for performing a write operation. Thus, in write mode this transistor is an active current source for transistors T10 and T12 arranged as a current switch circuit. Transistors T10 and T12 have their emitters connected to the collector of T8. The base of T12 is connected to a reference write voltage $W_{REF}$ and the base of T10 receives the data-in bit to be written in the cell. The collectors of T10 and T12 are connected to the anodes of diodes S6 and S4, respectively. These collectors are also connected through resistors R6 and R4 to read/write voltage reference generator W/R REF 22.

The collector of T12 is also connected to the base of transistor T14, the emitter of which is connected to the left bit line $LBL_j$ and the collector of which is connected to supply voltage V.

The emitter of transistor T16 is connected to the right bit line RBLj, its base is connected to the anode of diode S6 and its collector is connected to supply voltage V through resistor R8.

Circuit 5 comprises transistor T18, diode-connected transistor T20 and resistor R10. Transistors T20 and T18 have their emitters grounded. The base of T18 is controlled by SEARCH signal which is set at a low level when a read/write operation is performed and at a high level in search mode. Collectors of T18 and T20 are connected to supply voltage V through resistor R10. The base of transistor T20 is connected to the bases of bit line transistors $LBT_1$ to $LBT_m$ and $RBT_1$ to $RBT_m$.

Consequently, in read/write mode, transistor T18 is OFF and diode-connected transistor is forward biased so that it is arranged as a current mirror with the bit line transistors in which the bit line current flows.

To perform a write operation, the data-in bit is applied to the base of T10. Assuming a "0" is to be written in the cell, T10 is set OFF and T12 is ON. Thus, T14 is OFF and T16 is ON.

T14 is arranged as a current switch with external transistor T2 in the cell which is set ON. T16 is arranged as a current switch with external transistor T3 of the cell which is OFF.

The condition T1, T2 ON and T3, T4 OFF is representative of a "0" stored in the cell.

Assuming a "1" is to be written in the cell, transistor T10 is set ON, transistor T12 is set OFF so that transistors T14 and T16 are ON and OFF, respectively.

The condition T1, T2 OFF and T3, T4 ON is representative of a "1" stored in the cell.

To perform a read operation, transistor T8 is set OFF. Thus, transistors T10 and T12 are inoperative and the status of the cell is detected by means of T16 arranged as a current switch with external transistor T3. Output driver 20 provides an indication of the cell content.

In search mode, circuit 5 does not provide the bit line current to the bit line transistors, thus transistors T14 and T16 are no longer arranged as current switch circuits with the cell transistors T2 and T3. Furthermore, transistor T6 is set ON, diodes S4 and S6 are forward biased so that transistors T14 and T16 are OFF.

In search mode, the bases of WDT transistors in each row are connected to reference voltage generator 3 as indicated in FIGS. 1 and 3. As shown in FIG. 3, generator 3 comprises two diode-connected transistors T30 and T32 connected in series, transistor T34 and resistors R30 and R32. The collector of transistor T30 is connected to node A and the emitter of T30 is connected to the collector of transistor T32. The emitter of transistor T32 is connected to the collector of transistor T34, whose emitter is grounded. Resistor bridge R30, R32 is connected accross collector and emitter terminals of transistor T34. The common node between resistors R30 and R32 is connected to the base of transistor T34. Such a generator provides at node A reference voltage VR1 which may be equal to 3.5 volts when V equals 5 volts.

Search reference circuit 13 generates search reference voltage $SREF$, which is adjusted to track as close as possible the mean value voltage of a word line in match and mismatch conditions.

To do this, circuit 13 comprises pairs of transistors which are arranged as the transistor cells. The right part of circuit 13 comprises transistors T36, T38, T39 and T40 and SBD diode S30. Transistor T40 has its emitter grounded, its base connected to supply voltage V1 through resistor R34 and generates at its collector node B a voltage which is equivalent to the lower bit line voltage in search mode.

Transistors T38 and T39 and SBD diode S30 are arranged as the transistors of a half cell, so that potential at the emitter of T38 is equal to the word line potential VMM in mismatch condition.

The left part of circuit 13 comprises transistors T42, T44, T45 and T46, resistor R38 and SBD diode S32. It generates a potential equal to the word line potential VM in match condition.

Transistor T46 is equivalent to the current source transistor TSi connected to the bottom line of the cell Ci,j. Transistors T44, T45 and diode S32 are arranged as a half cell, so that the potential at the emitter of T44 is equal to VM.

Equal value resistors R40 and R42 arranged in series between the emitters of T44 and T38 provide the midgap point P between potentials VM and VMM.

Transistors T36 and T42 with resistors R36 and R38 have the function of word driver transistor WDT and resistor R1 with respect to the respective half cell.

The arrangement of transistors T48, T49, diode-connected transistors T50, T51 and transistor T52 connected at node P insures that circuit 13 can drive a plurality of search circuits.

Transistor T48 has its base connected to the base of T46 so that the same current flows in both transistors.

Transistors T50 and T51 are diode connected transistors arranged in series between supply voltage V and the collector of T48. Transistor T49 has its base connected to node P, its emitter connected to the collector of T48 and its collector connected to supply voltage V.

Search reference voltage $SREF$ is generated at the emitter of T52 which has its collector connected to supply voltage V and its base connected to the base of T51.

$SREF$ is at exactly the same potential as node P. It is used in all search circuits 11-1 to 11-n, as will be explained later on. There is only one such circuit 13 while the number of search circuits 11 is equal to the number of word lines.

Search mode control circuit 7 of each column comprises two double-emitter transistors T56 and T58.

One of the emitters of transistors T56 and T58 is provided with the SEARCH control signal which is set at its UP level during a search operation. This leads to pull down all bit line currents. The bases of transistors T56 and T58 are connected to supply voltage V1 through resistors R42 and R46, respectively. The collectors of T56 and T58 are connected to supply voltage V1 through resistors R44 and R48, respectively, and are connected to the bases of left bit line transistor $LBT_j$ and right bit line transistor $RBT_j$, respectively.

The argument data-in $DI_j$ and its complement $\overline{DI_j}$ are provided to the second emitters of T56 and T58, respectively.

In read/write mode, transistors T56 and T58 are ON, so that the argument circuits are inoperative and the bit line transistors $LBT_j$ and $RBT_j$ are under the control of circuit 5.

Assuming $DI_j = 1$: T56 is OFF and T58 is ON. Left bit line $LBL_j$ is lowered to collector-emitter $V_{CE}$ voltage of transistor $LBT_j$. Assuming that T1 and T2 are ON, indicating that a "0" is stored in the cell, the voltage of the word line is lowered by a voltage swing equal to or smaller than the forward voltage of SBD diode S1 in the cell. Consequently, the voltage change on the word line is $\Delta WL < VS$.

The mismatch current flows through T1, external transistor T2 of the cell and bit line transistor $LBT_j$. It is limited by resistor R1-i and can be adjusted to a small value IMM depending on the resistor value such that $IMM < VS/R1\text{-}i$.

When $DE_j = 0$, T58 is OFF and T56 is ON, the voltage of the right bit line is lowered to $V_{CE}$.

External transistor T3 remains almost OFF and the potential of the word line is not changed. This corresponds to a match condition and no search current flows through the cell.

The argument search bit $DI_j$ is provided to all cells in column j and a match or mismatch condition occurs in each cell.

The match condition of all cells in a row i is detected by means of search circuit 11-i connected to corresponding word line WLi.

Search circuit 11-i comprises two transistors T60 and T62 making a differential amplifier. T60 and T62 have their emitters connected to the collector of current source transistor T64 which has its emitter connected to the ground through resistor R50.

The base of transistor T64 is provided with the SEARCH control signal, to inhibit the operation of circuit 11-i in read/write mode.

The base of transistor T60 is connected to the word line WLi and the base of transistor T62 is provided with the search reference $SREF$. The collector of transistor T60 is connected to supply voltage V and the collector of transistor T62 is connected to supply voltage V through resistor R52.

If a match occurs in the m cells attached to the word line WLi, the potential of the word line is higher than $SREF$, so that transistor T60 is on and transistor T62 is OFF. The output voltage OUT taken at the collector of transistor T62 is at an UP level indicative of a MATCH condition.

If a MISMATCH condition occurs in at least one of the m cells connected to the word line, the potential of this word line is less than $SREF$ so that transistor T60 is OFF and transistor T62 is ON. Output voltage OUT is at a DOWN level indicative of a MISMATCH condition.

Once a search operation is completed, all word lines are restored to a standby level voltage by search restore circuit 15.

Search restore circuit 15 is common to all word lines and is connected to the base of transistor TRi, having its emitter connected to word line WLi and its collector connected to supply voltage V.

Circuit 15 comprises transistors T70, T72 and T74 and resistors R60, R62 and R64 which are arranged as transistors T30, T32 and T34 and resistors R30, R32 and R2-i of circuit 3.

In addition, circuit 15 comprises diode connected transistor T76 and transistor T78. Transistor T76 has its base connected to its collector, its emitter connected to the collector of transistor T78, whose emitter is grounded. Conduction of transistor T78 is controlled by the SEARCH control signal provided to its base.

The collector of transistor T70 is connected to the base of transistor TRi through resistor R66. The base of transistor TRi is also connected to current source transistor T80.

The operation of circuit 15 is as follows. Two conditions may occur in search mode: a match condition which entails that the word line voltage does not change or a mismatch condition which causes the word line voltage to be lowered by VS which is approximately equal to 0.5 volt.

Once the word line voltage is lowered, all word lines have to be restored. To do this, circuit 15 acts as a pull up driver to rapidly raise the word line voltages to their accurate quiescent values. For this reason, circuit 15 requires a perfect tracking with reference voltage VR1.

The word line voltage is:

$$kV_{BE}(T34)+V_{BE}(T32)+V_{BE}(T30)-V_{BE}(WDT)-(R1-i)I,$$

with $I=\Sigma\ ImSTY$, ImSTY being the standby current in each cell, k being the ratio of resistances R30 and R32, and $V_{BE}$ being the base emitter voltage of the transistor indicated in parenthesis.

In the search restore circuit, the same voltage is generated on the word line, namely :

$$kV_{BE}(T74)+V_{BE}(T70)+V_{BE}(T72)-I\cdot R66-V_{BE}(TRi)$$

An equal voltage is generated, because R66 and current source transistor T80 are designed to get $I\cdot R66=I\cdot R1-i$ so as to obtain a perfect tracking.

Transistors T76 and T78 are used to enable/inhibit search restore circuit 15.

During search mode, transistors T76 and T78 are ON, lowering the voltage at nodes C and D, which allows the voltage of the word line to go down.

In no search mode, T78 and T76 are OFF and TRi turns on. The word line voltage is raised to its quiescent value.

The specific embodiments of circuits 13 and 15 represented in FIG. 3 give the memory a number of advantages.

Circuits 13 and 15 secure a very good temperature compensation and are not sensitive to the V supply voltage variations. Furthermore, in search reference generator or circuit 13, a perfect tracking between the word line voltage in search mode and the search reference voltage is obtained, and in circuit 15 there is a perfect tracking between voltage VR1 at node A and the voltage at node D.

While the invention has been particularly shown and described with reference to preferred embodiments thereof, it will be understood by those skilled in the art that various changes in form and details may be made therein without departing from the spirit and scope of the invention.

What is claimed is:

1. A memory including a matrix arrangement of cells connected to n word lines and to m pairs of left and right bit lines wherein the selection of said word lines is made by means of word line driver transistors having their control electrodes connected to an address decoding and selection circuit, one of their conductive electrodes coupled to the word lines and the other conductive electrode connected to a supply voltage and read and write circuits for performing read or write operations in the cells, characterized in that said memory comprises peripheral circuits allowing the memory to be used either as a random access memory or as an associative memory having a search mode, said peripheral circuits including:

means responsive to a search control signal for inhibiting said read/write circuits and said word address decoding and selection circuit, said read/write circuits being coupled to said m pairs of left and right bit lines, means for providing a first reference voltage to all control electrodes of said word line driver transistors in the search mode, search mode control means connected to each of said m pairs of left and right bit lines responsive to said search control signal and to an argument data-in bit to allow the potential of one of said left or right bit lines to be lowered depending upon the argument data-in bit value such that in search mode a mismatch current flows into the cell when the data-in bit does not match the cell content, and detection means connected to each of said word lines and responsive to a search reference potential for generating a signal indicative of a match condition of all cells connected to a respective one of said word lines and indicative of a mismatch condition of at least one cell connected to said one word line.

2. A memory according to claim 1, further comprising comprises search restore means coupled to said word lines for restoring all word lines to a standby level voltage after a search operation is completed, said search restore means including a voltage generator, means for selectively operating said voltage generator, n driver transistors, each having a first conductive electrode connected to a word line and a second conductive electrode connected to a supply voltage source, with a control electrode being connected to said voltage generator.

3. A memory according to claim 1 characterized in that said cells are of the Harperpnp type having an upper node connected to one of said word lines and a lower node connected to a bottom line, said bottom line being connected to a current source transistor.

4. A memory including a matrix arrangement of cells connected to n word lines and to m pairs of left and right bit lines wherein the selection of said word lines is made by means of word line driver transistors having their control electrodes connected to an address decoding and selection circuit, one of their conductive electrodes connected to the word lines and the other conductive electrode connected to a supply voltage and read and write circuits for performing read or write operations in the cells connected to a selected word line, characterized in that said memory comprises peripheral circuits allowing the memory to be used either as a random access memory or as an associative memory having a search mode, said peripheral circuits including:

means responsive to a search control signal for inhibiting said read/write circuits and said word address decoding and selection circuit, means for providing a first reference voltage to all control electrodes of said word line driver transistors in the search mode, search mode control means connected to each pair of said left and right bit lines responsive to a search control signal and to an argument data-in bit to allow the potential of one of said left or right bit lines to be lowered depending upon the argument data-in bit value such that in search mode a mismatch current flows into the cell when the data-in bit does not match the cell content, detection means connected to each word line and responsive to a search reference potential for generating a signal indicative of a match condition of all cells connected to the word line and indicative of a mismatch condition of at least one cell connected to the corresponding word line, and a plurality of pairs of left and right bit line driver transistors each having a first conductive electrode connected to one of said bit lines, a second conductive electrode connected to a reference potential and said search mode control means associated with each pair of said bit lines comprising, a first double-emitter transistor having a collector connected to the control electrode of said left bit line driver transistor, a first emitter arranged to receive a true value of the argument data-in bit and a second emitter arranged to receive the search control signal, and a second double-emitter transistor having a collector connected to the control electrode of said right bit line driver transistor, a first emitter arranged to receive a complement value of the argument data-in bit, a second emitter arranged to receive the search control signal, said search control signal having a value which makes said search mode control means inoperative in said read/write mode and operative in said search mode so as to cause the potential of said word lines corresponding to rows of cells, the contents of which do not match the argument data-in bits, to be lowered and the potential of the word lines corresponding to rows of cells, the contents of which match the argument data-in bit, to remain unchanged.

5. A memory including a matrix arrangement of cells connected to n word lines and to m pairs of left and right bit lines wherein the selection of said word lines is made by means of word line driver transistors having their control electrodes connected to an address decoding and selection circuit, one of their conductive electrodes connected to the word lines and the other conductive electrode connected to a supply voltage and read and write circuits for performing read or write operations in the cells connected to a selected word line, characterized in that said memory comprises peripheral circuits allowing the memory to be used either as a random access memory or as an associative memory having a search mode, said peripheral circuits including:

means responsive to a search control signal for inhibiting said read/write circuits and said word address decoding and selection circuit, means for providing a first reference voltage to all control electrodes of said word line driver transistors in the search mode, search mode control means connected to each pair of said left and right bit lines responsive to a search control signal and to an argument data-in bit to allow the potential of one of said left or right bit lines to be lowered depending upon the argument data-in bit value such that in search mode a mismatch current flows into the cell when the data-in bit does not match the cell content, and detection means connected to each word line and responsive to a search reference potential for generating a signal indicative of a match condition of all cells connected to the word line and indicative of a mismatch condition of at least one cell connected to the corresponding word line, said detection means associated with each of said word lines comprising first and second transistors arranged as a differential amplifier, the base of said first transistor arranged to receive the search reference potential having a value which is equal to the mean value of the voltages of the word line in match and in mismatch condition, and the base of the second transistor is connected to a respective one of said word lines, so as to provide the match or mismatch indication on one conductive electrode of said first transistor, and a current source transistor connected to a common conductive electrode of said first and second transistors, the conduction of said current source transistor being under the control of the search control signal.

6. A memory according to claim 5 characterized in that the search reference voltage is generated from the first reference voltage through a generator comprised of first and second parts, wherein said first part includes a first pair of transistors arranged as the transistors of a one half cell connected to a first driver transistor having a base to which said first reference voltage is applied and connected to a first current source transistor, said second part includes a second pair of transistors arranged as the transistors of a one half cell connected to a second driver transistor having a base to which said first reference voltage is applied and connected to a second current source transistor, and means responsive to the voltage generated at the upper nodes of said first and second pairs of transistors making the half cells for generating therefrom said search reference potential.

* * * * *